US006728824B1

(12) United States Patent
Chen

(10) Patent No.: US 6,728,824 B1
(45) Date of Patent: Apr. 27, 2004

(54) METHOD AND APPARATUS FOR CONTROLLING MULTI-CHANNEL BITSTREAMS

(75) Inventor: Joey Y. Chen, Los Angeles, CA (US)

(73) Assignee: NJR Corporation, Mountain View, CA (US)

( * ) Notice: Subject to any disclaimer, the term of this patent is extended or adjusted under 35 U.S.C. 154(b) by 0 days.

(21) Appl. No.: 09/398,509

(22) Filed: Sep. 17, 1999

(51) Int. Cl.[7] .............................................. G06F 13/00
(52) U.S. Cl. ........................... 711/1; 711/100; 711/154
(58) Field of Search ............................. 711/1, 100, 121, 711/154, 200, 170, 165; 370/431, 464

(56) References Cited

U.S. PATENT DOCUMENTS

| 5,621,678 A | * | 4/1997 | Barnaby et al. .............. 365/52 |
| 5,835,738 A | * | 11/1998 | Blackledge, Jr. et al. ... 710/127 |
| 5,860,101 A | * | 1/1999 | Arimilli et al. .............. 711/121 |
| 5,983,303 A | * | 11/1999 | Sheafor et al. .............. 710/126 |
| 5,983,765 A | * | 11/1999 | Sandford ...................... 83/641 |
| 6,094,710 A | * | 7/2000 | Arimilli et al. .............. 711/153 |

* cited by examiner

Primary Examiner—Tuan V. Thai
(74) Attorney, Agent, or Firm—Perkins Coie LLP

(57) ABSTRACT

A memory controller for an incoming multi-channel bitstream including a computer memory having an address range, a plurality of memory controllers, and a selector coupling the memory controllers to the computer memory. Each memory controller is capable of providing an address within the address range of the computer memory. In use, the selector selects a memory controller based on a received data type in an incoming bitstream. The selector then provides an address received from the selected memory controller to the computer memory.

9 Claims, 9 Drawing Sheets

METHOD AND APPARATUS FOR CONTROLLING MULTI-CHANNEL BITSTREAMS

BACKGROUND OF THE INVENTION

The present invention relates to multimedia system performance. More particularly, the present invention relates to methods and apparatus for controlling an incoming multi-channel bitstream.

There has been a rapid evolution from analog video technology to digital video technology because of the advantages that digital video has to offer. Digital video can be stored and distributed more cheaply than analog video because digital video can be stored on randomly accessible media such as magnetic disc drives (hard disks) and optical disc media known as compact (CDs). Once stored on a randomly accessible media, digital video may become interactive, allowing it to be used in games, catalogs, training, education, and other applications.

One of the newest products to be based on digital video technology is the digital video disc, sometimes called "digital versatile disc" or simply "DVD." These discs are the size of an audio CD, yet hold up to 17 billion bytes of data, 26 times the data on an audio CD. DVD storage capacity (17 Gbytes) is much higher than CD-ROM (600 Mbytes) and a DVD can deliver the data at a higher rate than CD-ROM. Therefore, DVD technology represents a tremendous improvement in video and audio quality over traditional systems such as televisions, VCRs and CD-ROM.

FIG. 1 is a block diagram showing a prior art multimedia system 10. The multimedia system 10 includes a DVD channel decoder 12, an external user/host computer 14, an external memory 16, a video encoder 18, a monitor 19, an audio playback 20, speakers 21, and an audio/video decoder chip 22. The audio/video decoder chip 22 includes an input front end 23, an audio/video decoding datapath 28, a display controller 30, an external memory interface 32, an external host interface 34, a synchronization module 36, and an audio interface 38. The input front end 23 includes an input parser 24 and a bitstream buffer controller 26.

In operation, the input parser 24 receives a bitstream from the DVD channel decoder 12. The input parser 24 processes the bitstream and passes it to the bitstream buffer controller 26, which in turn processes the bitstream and passes it to the external memory 16 using the external memory interface 32. The bitstream then travels from the external memory 16 to the audio/video datapath 28, again using the external memory interface 32. Next, the display controller 30 receives decoded picture data from the audio/video datapath 28 and passes the decoded picture data to the video encoder 18, which then displays a video image using the monitor 19. Also, the audio interface 38 receives decoded audio data from the audio/video datapath 28 and passes the decoded audio data to the audio playback 20, which plays the audio using the speakers 21.

In addition, the audio, video, and other bitstream data are synchronized throughout the system by the synchronization module 36. Furthermore, additional parameters provided by the external user/host computer 14 are passed to the rest of the system 10 by the external host interface 34.

FIG. 2 is a block diagram showing a prior art input front end 23. The input front end 23 includes an input parser 24 and a bitstream buffer controller 26. The bitstream buffer controller 26 includes a buffer memory 40 and a memory controller 42.

In use, the input parser receives a bitstream 44, parses the bitstream 44 into a data type 50 and associated data 52, and provides the data type 50 and associated data 52 to the bitstream buffer controller 26. The bitstream 44 typically includes video data, audio data, sub-picture data, and navigation data. The input parser recognizes the type of data being received and provides the data type information 50 to the bitstream buffer controller 26, along with the associated data 52. Since other system components are generally unable to distinguish the type of data being received, the data type 50 is stored with each data word 52. Then, during read operations, the data type is provided to system components along with the associated data 52 from the buffer memory.

When the memory controller 42 receives a signal to write data to the buffer memory 40, the memory controller provides a memory address for writing the data type 50 and the associated data 52 to the buffer memory 40. Later, when the data 52 needs to be read by other system components, the memory controller 42 provides the address for the requested data. The data type 50 and associated data 52 are then provided to the rest of the system. It should be noted that both the data type 50 and the associated data 52 are written in the buffer memory in a conventional bitstream buffer controller.

One problem with the conventional bitstream buffer controller is that both the data type and the associated data are stored in the buffer memory, resulting in less buffer memory being available for actual data. Generally, the additional bits required to store the data type increase the amount of buffer memory needed to support the system. The additional buffer memory then results in increased manufacturing cost.

Additionally, the conventional bitstream buffer controller is generally not flexible enough to support high speed hardware. Typically, the bitstream buffer controller receives and sends data at 27 MHz. However, new system components often require data to be sent at 81 MHz. Since the conventional bitstream buffer controller often cannot provide data at 81 MHz, many new system components may not be supported by a conventional bitstream buffer controller.

In view of the forgoing, what are need are improved methods and apparatuses for controlling incoming multi-channel bitstreams. The methods should be able to operate with reduced memory, and should be flexible enough to support 81 MHz data access.

SUMMARY OF INVENTION

The present invention addresses these needs by providing a memory controller for an incoming multi-channel bitstream. In one embodiment, the memory controller includes a computer memory having an address range, a plurality of memory controllers, and a selector coupling the memory controllers to the computer memory. Each memory controller is capable of providing an address within the address range of the computer memory. In use, the selector selects a memory controller based on a received data type in an incoming bitstream. The selector then provides an address received from the selected memory controller to the computer memory.

In another embodiment, a method for controlling a memory storing a portion of an incoming bitstream is disclosed. The method comprises receiving an incoming bitstream having a data type and associated data. Next, a memory controller is assigned to the data type based on the availability of appropriate memory controllers. Finally, the associated data is then written to computer memory using the memory controller assigned to the data type.

In yet another embodiment, a request for data is received. Next, the selector determines an appropriate memory controller to read the requested data from computer memory. This determination typically includes, among other things, checking to see if the requested data is still available in the computer memory. Finally, the requested data is read from the computer memory utilizing the appropriate memory controller.

Advantageously, the use of various memory controllers allows the present invention to store data from an incoming bitstream without storing an associated data type for each data word. Unlike conventional bitstream buffers that store the data type along with each data word, the present invention avoids this by keeping track of which memory controller is currently assigned to each memory type.

In addition, the present invention allows data access at 81 MHz. By keeping track of the amount of data stored in each memory address range, the present invention knows ahead of time how much data of a particular data type needs to be read from memory. This allows the system to access data at faster speeds, since the system no longer needs to continuously check each data word to determine if all the data of a particular data type has been read.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

An invention is disclosed for controlling a multi-channel bitstream. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

Figure 1:
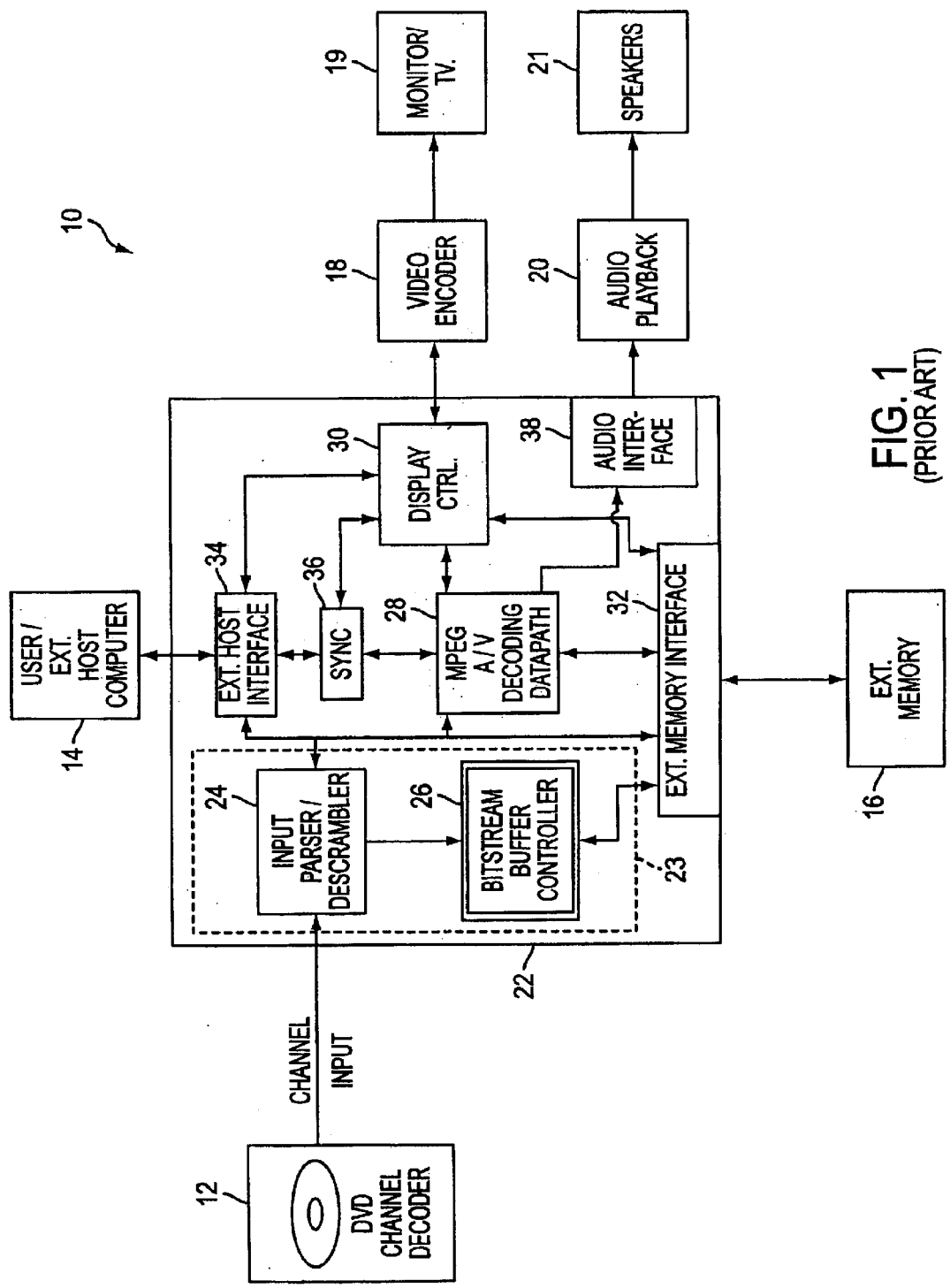
FIG. 1 is a block diagram showing a prior art multimedia system.
Figure 2:
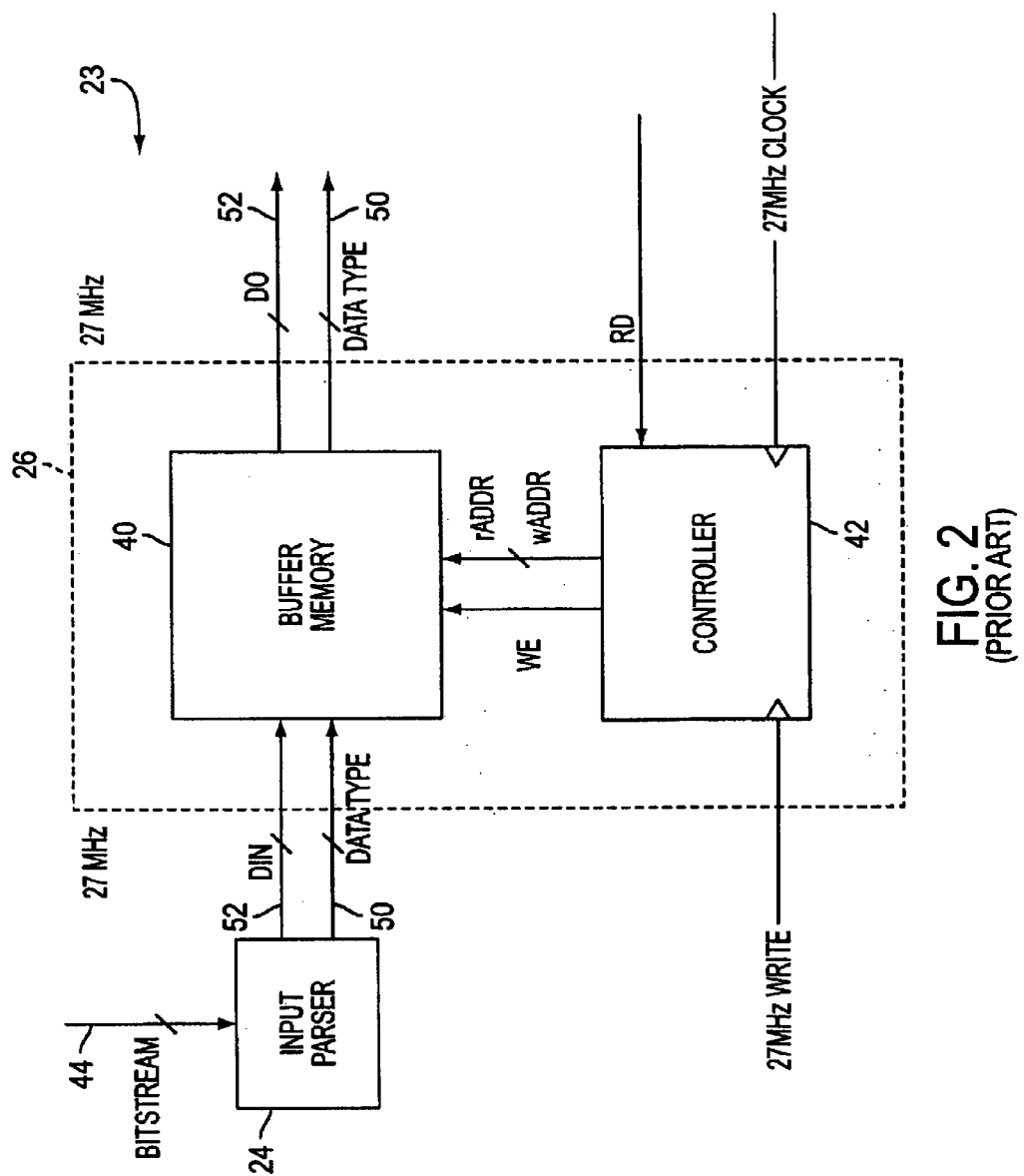
FIG. 2 is a block diagram showing a prior art input front end.
Figure 3:
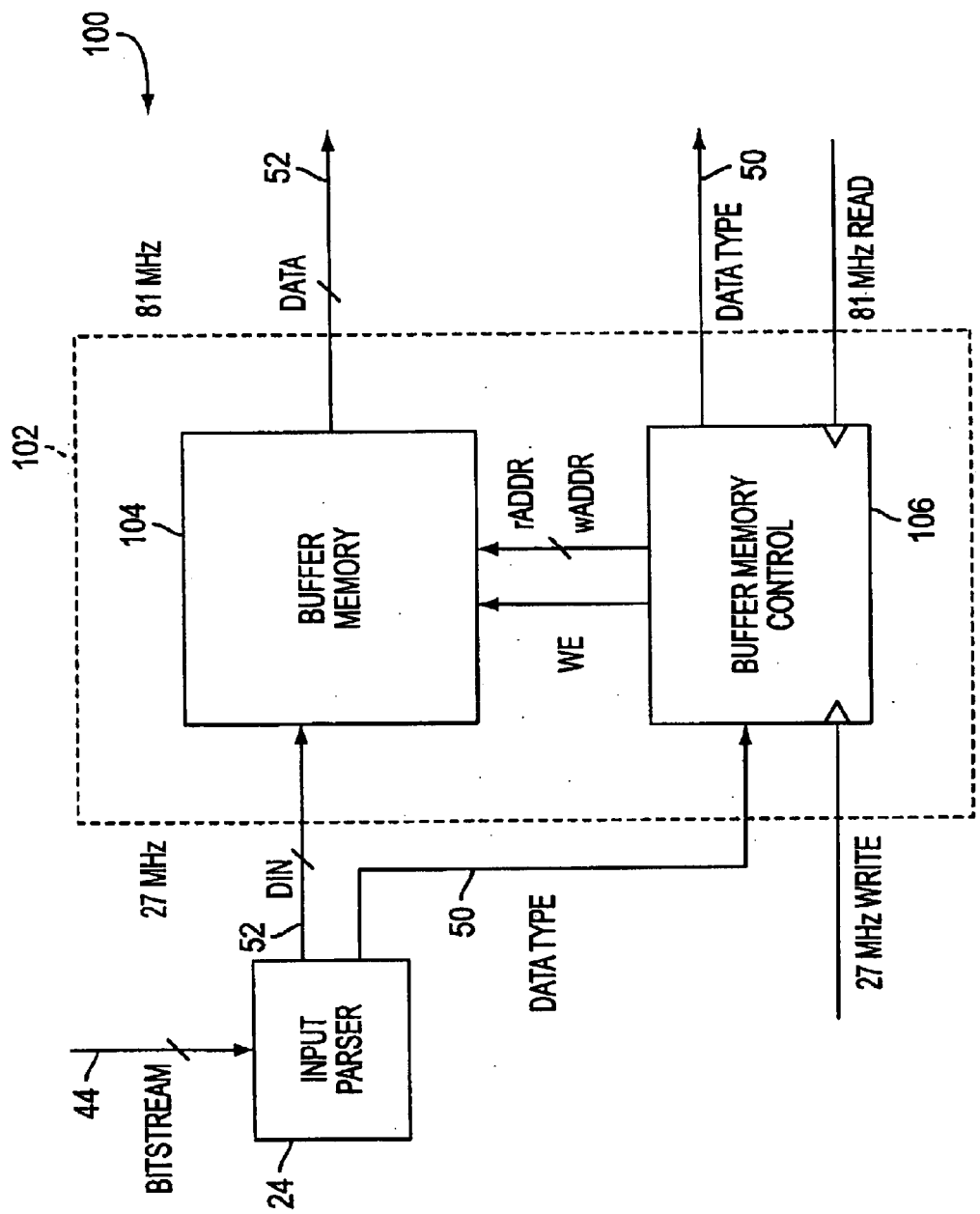
FIG. 3 is a block diagram showing an input front end, in accordance with an embodiment of the present invention.

FIGS. 1 and 2 were described in terms of the prior art. FIG. 3 is a block diagram showing an input front end 100, in accordance with an embodiment of the present invention. The input front end 100 includes an input parser 24 and a bitstream buffer controller 102. The bitstream buffer controller 102 includes buffer memory 104 and buffer memory control 106.

In use, the input parser 24 receives the bitstream 44 and parses it into a data type 50 and associated data 52. The data 50 is then made available to the buffer memory 104, while the data type 52 is provided to the buffer memory control 106. The bitstream 44 provides data 52 of a given data type 50 in groups or "chunks" of data 50. Thus, each group of data 52 includes only one data type 50, and therefore one data type 50 can be used to identify all the data 52 of a given data group.

Thus, the data type 50 is not stored in the buffer memory 104. Instead, the buffer memory control 106 keeps track of the location in memory of received data 52 associated with each data type 50. In this manner, when a request for data is received by the bitstream buffer controller 102, the buffer memory control 106 determines in what memory location the requested data is stored based on the data type requested. The buffer memory 104 then provides the actual data 52 to the requesting system component. In addition to providing the data 52 as requested by the system, the bitstream buffer controller 102 also knows ahead of time how much data of a given data type needs to be read. This look-ahead ability allows the present invention to provide data access at 81 MHz, as required by newer system components. Since the system no longer has to spend time evaluating the data type for each data word, the system can operate at a much higher bus speed.

Figure 4:
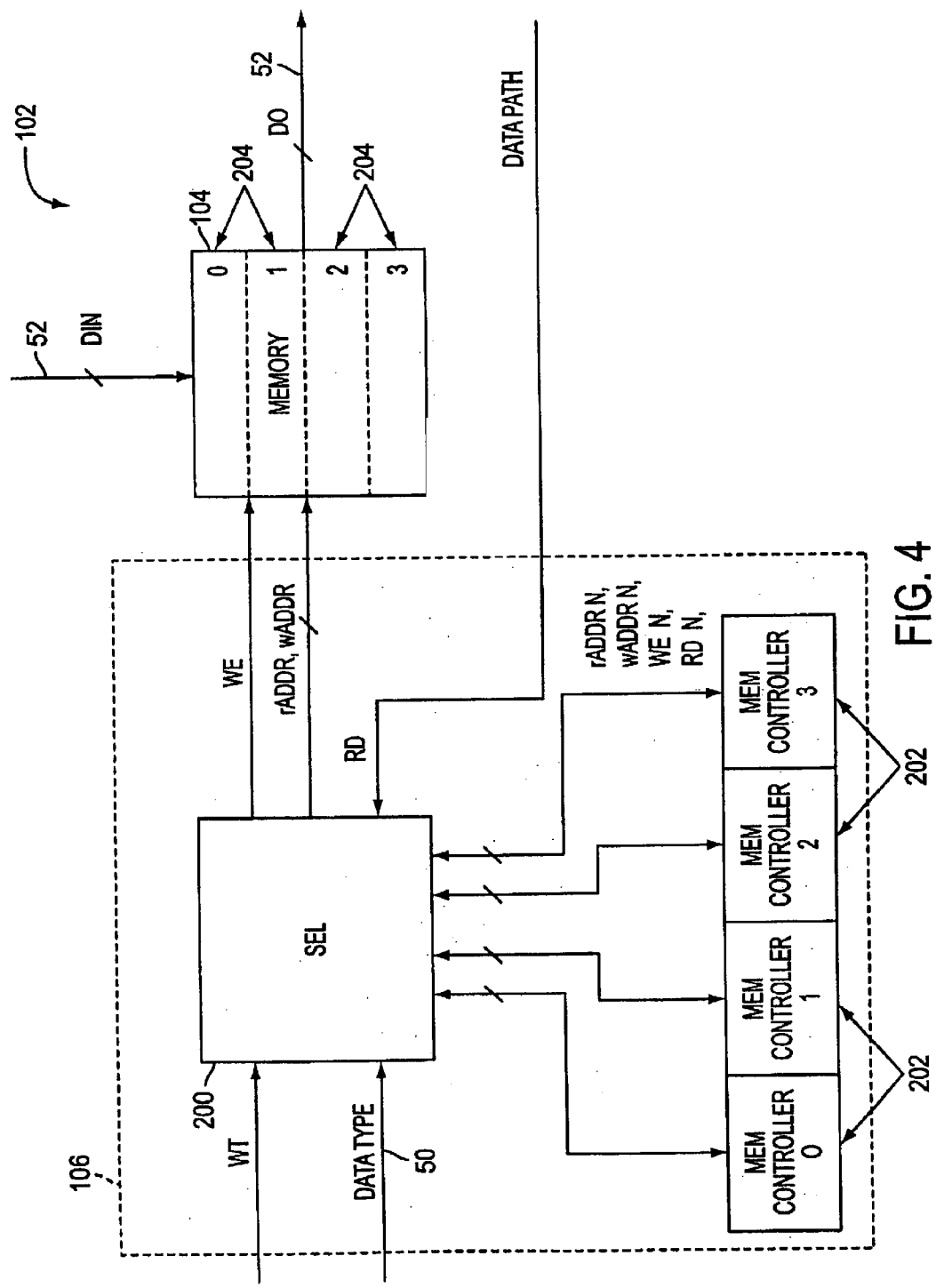
FIG. 4 is a block diagram showing a bitstream buffer controller, in accordance with another embodiment of the present invention.

FIG. 4 is a block diagram showing a bitstream buffer controller 102, in accordance with another embodiment of the present invention. The bitstream buffer controller 102 includes a buffer memory 104 and a buffer memory control 106. The buffer memory control 106 includes a selector 200 and a plurality of memory controllers 202. The buffer memory 104 includes a plurality of memory address ranges 204. Each memory controller 202 addresses a predetermined memory address range 204.

In operation, the selector 200 receives the data type 50, while the associated data 52 is received by the buffer memory 104. The selector 200 then determines which of the memory controllers 202 is available to write the data 52 to the buffer memory 104. Once the selector 200 determines which memory controller 202 to use for the current write operation, the selector 200 assigns the current data type 50 to the selected memory controller 202. The memory controller 202 then provides a write address, within its corresponding predetermined memory address range 204, to the selector 200. The selector 200 then uses the provided memory address to write the current data to the buffer memory 104.

In one embodiment, the bitstream buffer controller operates on data on a first-in first-out basis. Thus, the data is provided to the rest of the system in the same order that it is received by the bitstream buffer controller. In this embodiment, the selector 200 alerts the system when data of a certain type needs to be read. The system then responds by requesting the data. However, other embodiments of the present invention can operate on the data in other ways, such as in a random order, on a stack basis, or any other manner as required by the system.

When the selector 200 receives a request for data, typically from the datapath, the selector 200 determines which memory controller 202 is assigned to the data type 50 of the requested data 52. The memory controller 202 assigned to the requested data type 50 then provides to the selector 200 the beginning memory address of the requested data, and the amount of data needing to be read. The selector 200 then uses the provided memory address to allow the system to read the requested data 52 from the buffer memory 104. Since the system is also provided with the amount of data needing to be read, it can read the data as a group, thus increasing system performance and allowing data access at 81 MHz.

Figure 5:
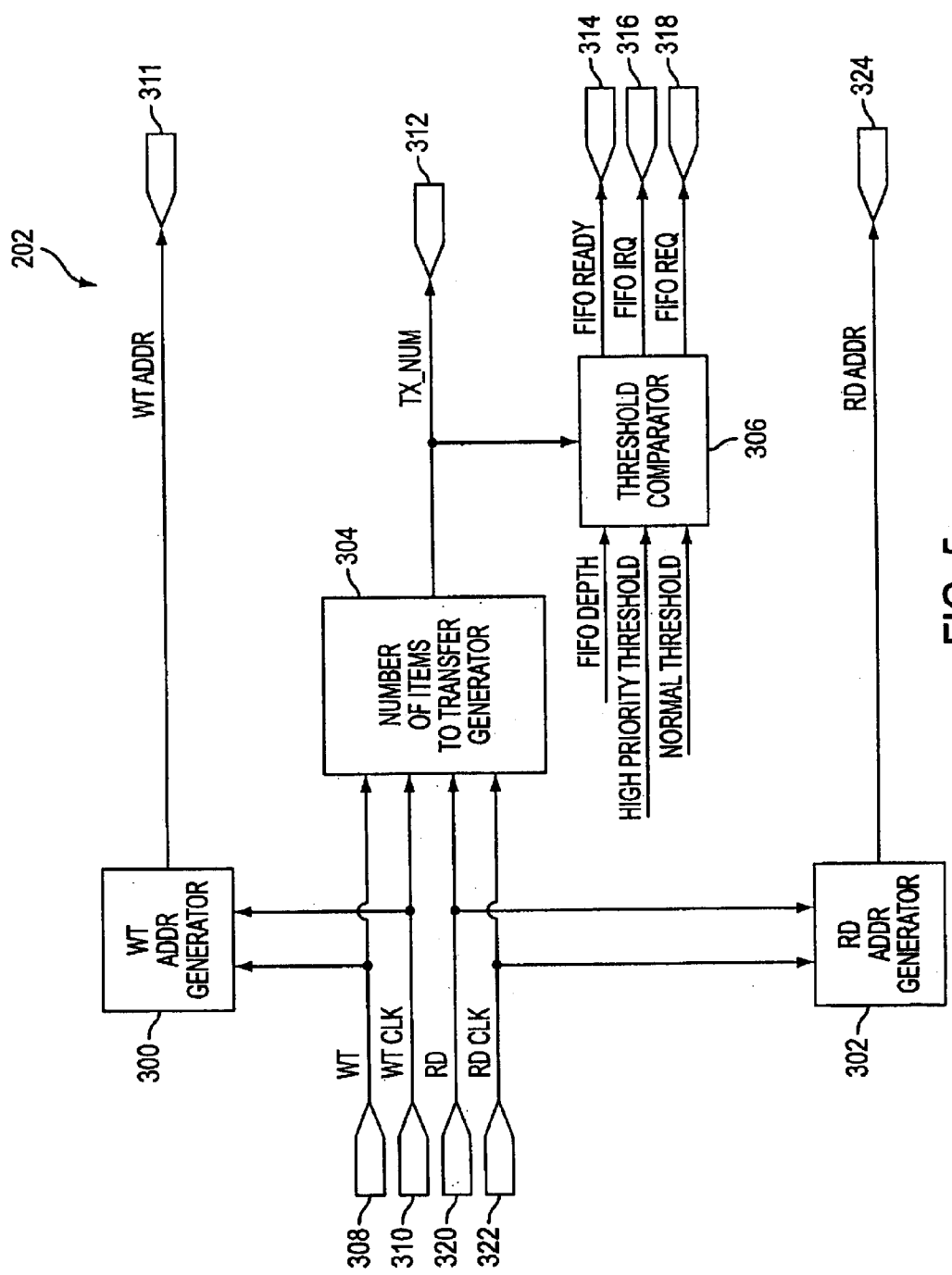
FIG. 5 is a block diagram showing a memory controller, in accordance with an embodiment of the present invention.

FIG. 5 is a block diagram showing a memory controller 202, in accordance with an embodiment of the present invention. The memory controller 202 includes a write address generator 300, a read address generator 302, a transfer number generator 304, and a threshold comparator 306. Both the write address generator 300 and the read address generator 302 are coupled to the transfer number generator 304. The transfer number generator 304 is coupled to the threshold comparator 306.

During a write operation, a write signal 308 and a write clock signal 310 are received by the write address generator 300 and the transfer number generator 304. The write address generator 300 then uses the signals to generate a write address 311 for the write operation. In addition, the transfer number generator 304 utilizes the write signal 308 and write clock signal 310 to generate a TX_NUM 312 parameter, which represents the number of items stored within the memory range addressed by the memory controller. Finally, the threshold comparator 306 uses the TX_NUM 312 parameter along with other parameters to generate READY 314, IRQ 316, and REQ 318 signals.

During a read operation, a read signal 320 and a read clock signal 322 are received by the read address generator 302 and the transfer number generator 304. The read address generator 302 then uses the signals to generate a read address 324 for the read operation. Similar to the write operation, the transfer number generator 304 utilizes the read signal 320 and read clock signal 322 to generate the TX_NUM 312 parameter. Finally, the threshold comparator 306 uses the TX_NUM 312 parameter along with other parameters to generate the READY 314, IRQ 316, and REQ 318 signals.

Figure 6:
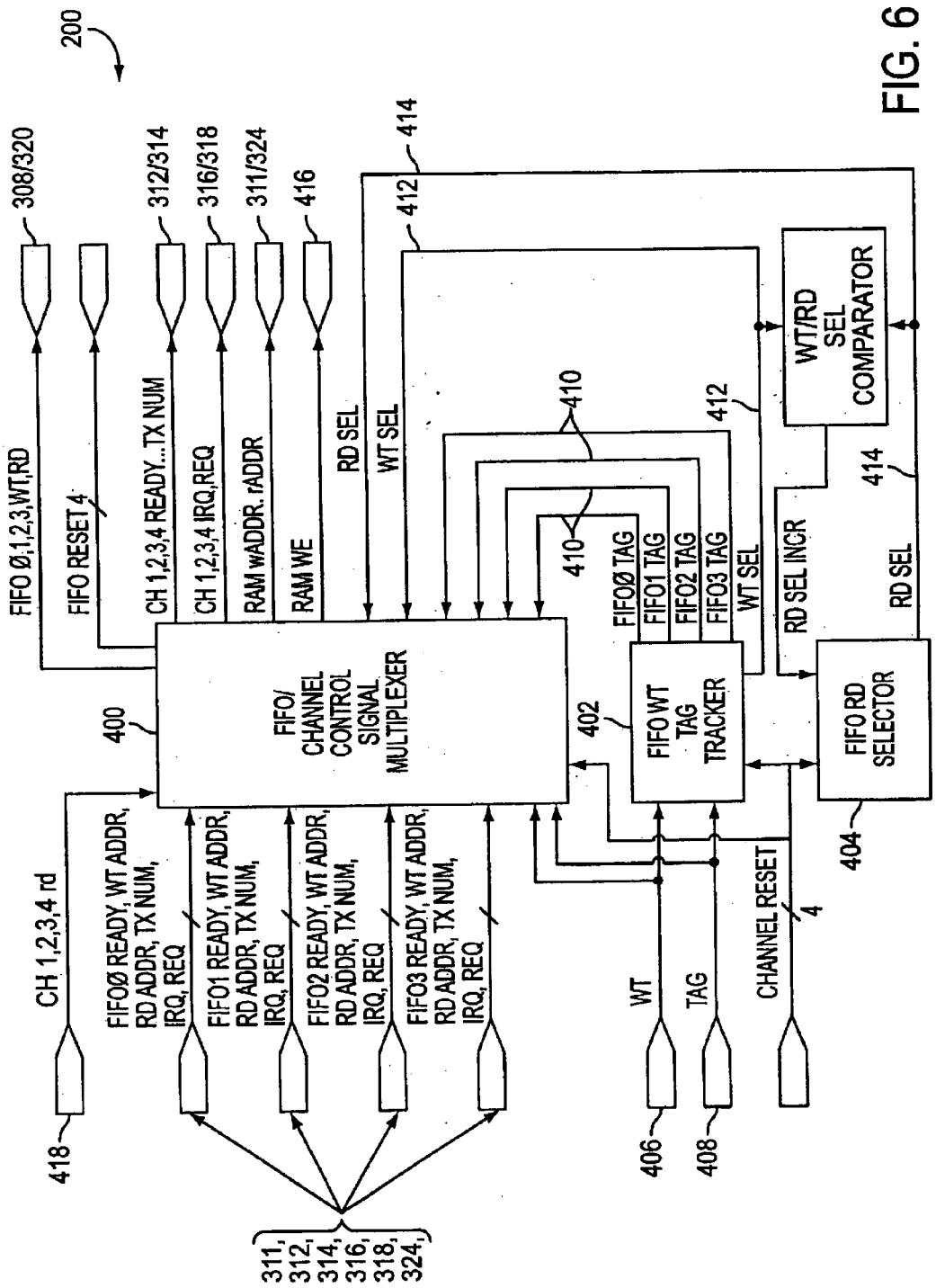
FIG. 6 is a block diagram showing a selector, in accordance with one aspect of the present invention.

FIG. 6 is a block diagram showing a selector 200, in accordance with one aspect of the present invention. The selector 200 includes a multiplexer 400, a tag tracker 402, and a read selector 404.

The selector 200 is used to select a set of signals generated by a memory controller 202, and map (or multiplex) the signals to an appropriate set of channel control signals, and vice versa. In use, each memory controller is assigned a channel ID when an input type arrives at the tag tracker 402 through the write signal 406 and TAG 408 signal, the TAG 408 signal representing the data type of the current data. The resulting memory controller TAG signals 410 are then used to keep track of the current data type contained in each memory address region corresponding to each respective memory controller.

The tag tracker 402 also generates a write select signal 412 that indicates which memory controller to use for generating an address for the current write operation. Similarly, during a read operation, the read selector 404 generates a read select signal 414 that indicates which memory controller to use for generating an address for the current read operation.

The multiplexer 400 uses the write select signal 412, the read select signal 414, the memory controller TAG signals 410, and other complimentary logic to select the appropriate memory controller to generate the appropriate write/read address 311/324 and write enable signal 416. In addition the multiplexer 400 multiplexes the memory controller output signals as the assigned channel output signals, such as the READY/TX_NUM 312/314, and IRQ/REQ 316/318 signals.

During read operations, incoming read signals 418 for the various channel data are mapped to the appropriate memory controller read signals by the read selector 404 and the multiplexer 400.

Figure 7:
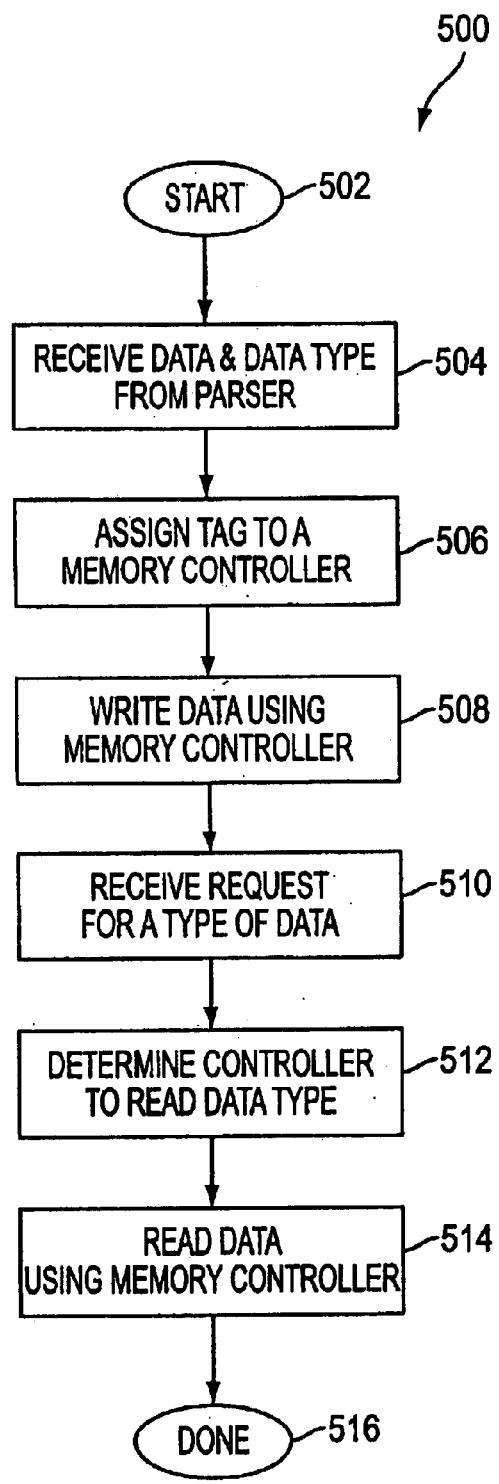
FIG. 7 is a flowchart showing a method for controlling a memory storing an incoming bitstream, in accordance with another aspect of the present invention.

FIG. 7 is a flowchart showing a method 500 for controlling a memory storing an incoming bitstream, in accordance with another aspect of the present invention. In an initial operation 502, pre-buffering operations are performed. Pre-buffering operations include reading a bitstream from a storage device, such as a DVD, and parsing the bitstream into data type and associated data.

In a receiving operation 504, a bitstream parsed into data type and associated data is received from the input parser. Data types include video data, audio data, sub-picture data, and navigation data. Navigation data includes control data (format, aspect ratio, parental management, etc.), search data (disc menu, title menu, audio menu, angle menus, etc.), user interface data (buttons, highlight information for interactive control), and navigation commands (CPU like arithmetic instructions, and flow control instructions).

Next, in assignment operation 506, the selector assigns the data type to a memory controller. Each memory controller controls a predetermined range of buffer memory. Preferably, the memory ranges covered by the various memory controllers do not overlap. The selector determines which memory controllers are available to write data to memory and selects an appropriate memory controller to use for the following write operation 508.

In a write operation 508, the selector writes the current data to the buffer memory utilizing the selected memory controller. The selected memory controller provides an address within the buffer memory to the selector. The selector then uses the provided memory address to write the current data to memory. In addition, the selected memory controller keeps track of the number of data items stored in buffer memory beginning at the provided address.

By using each memory controller to address only one data type at any time, the present invention avoids using additional memory to store the data type along with each data word. As discussed in detail below, the present invention determines the type of data stored in the buffer memory by using the corresponding memory controller.

Next, in a request operation 510, the selector receives a request for data from the system. In one embodiment, the bitstream buffer controller operates on data on a first-in first-out basis. Thus, the data is provided to the rest of the system in the same order that it is received by the bitstream buffer controller. In this embodiment, the selector alerts the system when data of a certain type needs to be read. The system then responds by requesting the data. However, other embodiments of the present invention can operate on the data in other ways, such as in a random order, on a stack basis, or any other manner as required by a system.

The selector then determines which memory controller is assigned to the data type of the requested data, in a determination operation 512. As mentioned previously, each memory controller controls a predetermined range of buffer memory, and, preferably the memory ranges do not overlap.

In a read operation 514, the selector enables the system to read the requested data from the buffer memory using the appropriate memory controller. The memory controller assigned to the requested data type provides the selector the beginning memory address of the requested data. In addition, the memory controller also provides the amount of data needing to be read to the selector. The selector then uses the provided memory address to allow the system to read the requested data from the buffer memory. Since the system is also provided with the amount of data needing to be read at that starting address, it can read the data as a group, thus increasing system performance by allowing data access at 81 MHz. Once the data is read, the system continues with further decoding and processing of the bitstream data, in operation 516.

Figure 8:
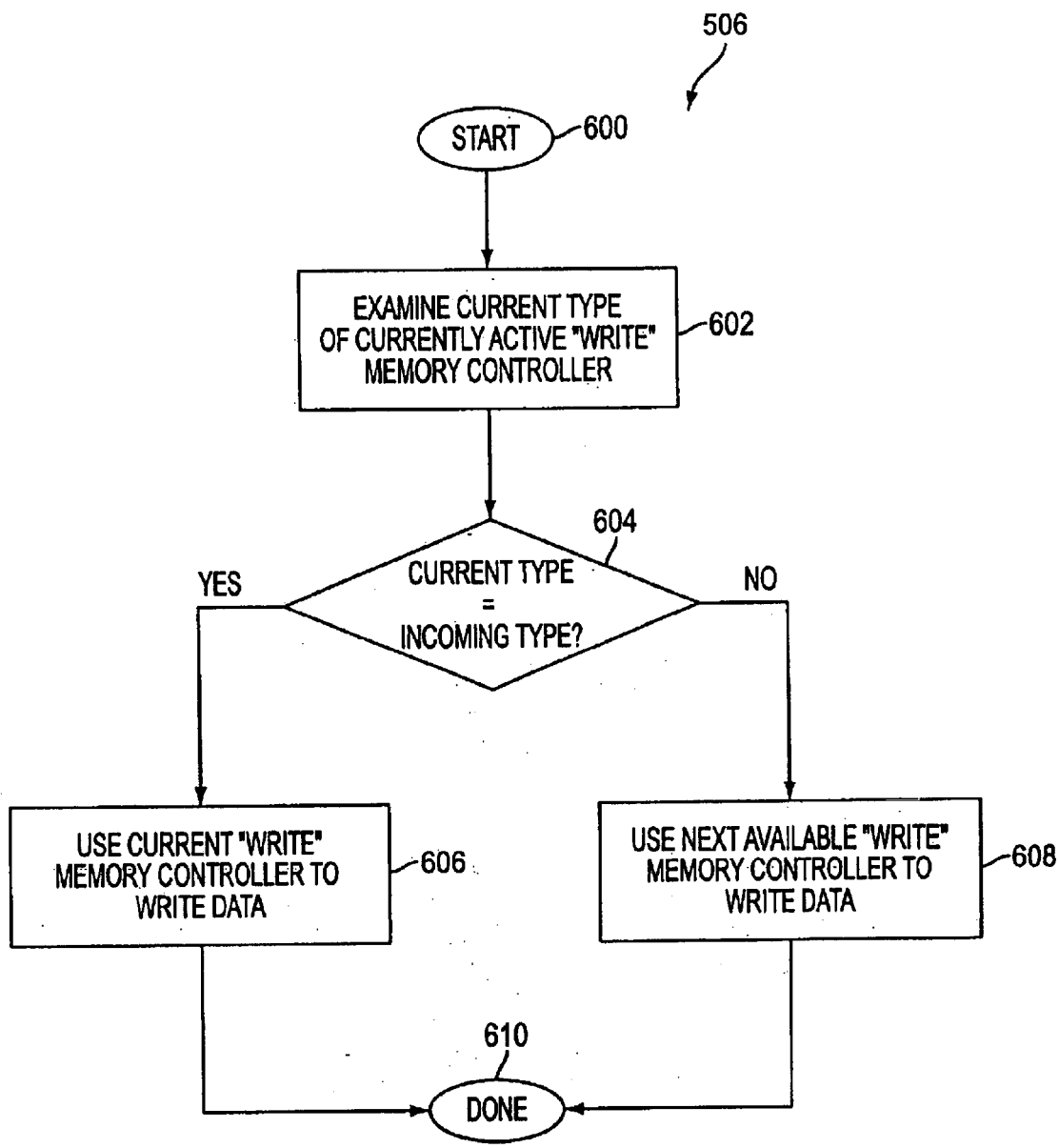
FIG. 8 is a flowchart showing a method for assigning a data type to a memory controller, in accordance with one embodiment of the present invention.

FIG. 8 is a flowchart showing a method 506 for assigning a data type to a memory controller, in accordance with one embodiment of the present invention. In an initial operation 600, pre-assignment operations are performed. Pre-assignment operations include parsing the input bitstream, and receiving the data type and associated data from the input parser.

In an examining operation 602, the data type of the current "write" memory controller is examined. The memory controller that perform the last write operation is termed the current "write" memory controller. Thus, the selector examines the current write controller to determine the type of data that is contained in its associated memory range in buffer memory. As stated above, the present invention uses each memory controller to handle only one data type at any one time. In this manner, the system avoids having to store the data type along with the associated data in buffer memory.

A decision is then made as to whether the current "write" memory controller data type is the same as the data type of the incoming data. If the current "write" memory controller data type is the same as the data type of the incoming data, the method 506 continues with a use current controller operation 606. If the current "write" memory controller data type is not the same as the data type of the incoming data, the method 506 continues with a use next controller operation 608.

When the current "write" memory controller data type is the same as the data type of the incoming data, the selector assigns the data type to the current "write" memory controller, in a use current controller operation 606. Since the current "write" memory controller is already controlling data of the current data type, the selector continues to use that memory controller to store the currently received data.

In a use next controller operation 608, the selector selects the next available "write" memory controller to write the current data to memory. The next available "write" memory controller is the next controller that either has no data type assigned to it, or is assigned the same data type as the data type of the current data.

Finally, in operation 610, the selector then uses the selected memory controller to write the current data to the buffer memory. The selected memory controller provides an address within the buffer memory to the selector. The selector then uses the provided memory address to write the current data to memory. In addition, the selected memory controller keeps track of the number of data items stored in buffer memory beginning at the address provided to the selector. By using each memory controller to address only one data type at any time, the present invention avoids using additional memory to store the data type along with each data word.

Figure 9:
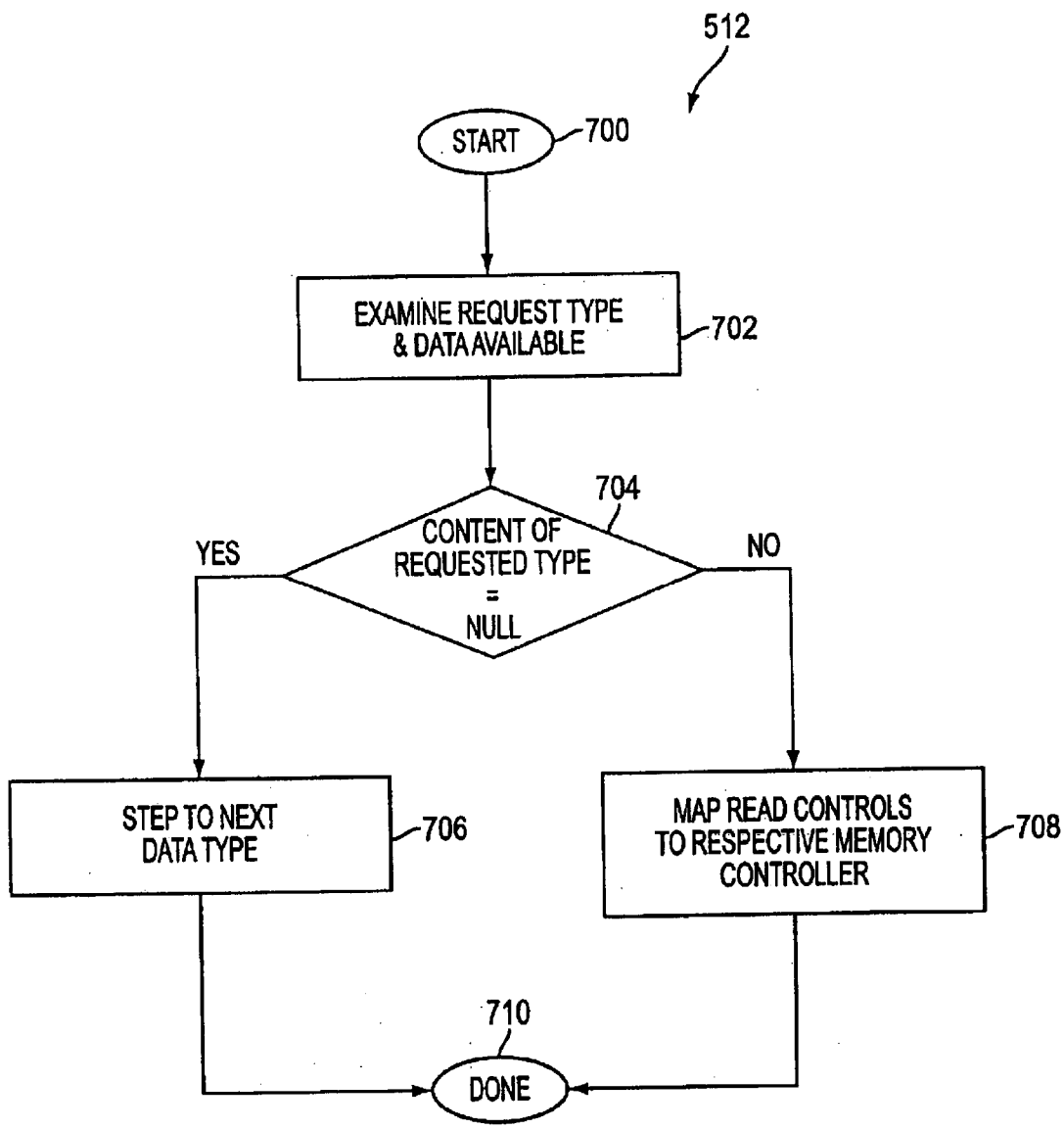
FIG. 9 is a flowchart showing a method for determining a memory controller to read a requested data type, in accordance with another embodiment of the present invention.

FIG. 9 is a flowchart showing a method 512 for determining a memory controller to read a requested data type, in accordance with another embodiment of the present invention. In an initial operation 700, pre-determination operations are performed. Pre-determination operations may include alerting the system that a particular data type needs to be read, and receiving a request for data.

In an examining operation 702, the data type of the requested data is examined along with the availability of the associated data. As stated previously, the present invention uses each memory controller to handle only one data type at any one time. Among other things, each memory controller maintains a record of the amount of data currently stored within its associated memory range within the buffer memory. Thus, the selector first determines the memory controller currently handling the requested data type. Then, the appropriate memory controller provides the amount of data currently stored within its associated memory range to the selector.

A decision is then made as to whether the amount of data currently stored within the associated memory range is greater than zero. If the amount of data currently stored within the associated memory range is not greater than zero, the method 512 continues with a next type operation 706. If the amount of data currently stored within the associated memory range is greater than zero, the method 512 continues with a map operation 708.

When the amount of data currently stored within the associated memory range is not greater than zero, the selector steps to the next available data type and alerts the system to read the data, in a next type operation 706. Since there is not currently any data of the requested data type to be read, the selector finds the next available data type and informs the system of its availability. The system then responds by requested the next available data type.

In a map operation 708, the selector maps the read signals of the appropriate memory controller to the selector read signals coupled to the buffer memory. The selector uses a read select signal, memory controller TAG signals, and other complimentary logic to select the appropriate memory controller to generate the appropriate read address. In addition the selector multiplexes the memory controller output signals as the assigned channel output signals, such as READY/TX_NUM, and IRQ/REQ signals.

Finally, in operation 710, the selector uses the selected memory controller to enable the system to read the current data from the buffer memory. The selected memory controller provides an address within the buffer memory to the selector. The selector then uses the provided memory address to enable the system to read the current data from memory.

In addition, the selected memory controller keeps track of the number of data items stored in buffer memory beginning at the provided memory address. This allows the system to know ahead of time how much data needs to be read. Thus, the requested data can be read from the buffer memory as a group or "chunk" of data, resulting in decreased access time. Therefore, the present invention allows the system to read data from the buffer memory at speeds of 81 MHz, as required by newer system components.

While the present invention has been described in terms of several preferred embodiments, there are many alterations, permutations, and equivalents which may fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A memory controller for an incoming multi-channel bitstream, comprising:

a computer memory having an address range;

a plurality of memory controllers, each memory controller being capable of providing at least one address within the address range of the computer memory; and a selector coupling the plurality of memory controllers to the computer memory, wherein the selector selects a memory controller based on a received data type in said incoming multi-channel bitstream, and wherein the selector provides at least one address to the computer memory that is received from the selected memory controller for the writing of at least a portion of said incoming bitstream, and wherein the selector is capable of receiving a request for data from a second system component, and wherein each memory controller includes controller outputs for providing controller output signals to the selector, and wherein the selector includes selector outputs to the computer memory, and wherein the selector is capable of multiplexing a particular memory controller's controller output signals to the selector for providing output signals to the computer memory.

2. A method for controlling a memory storing at least a portion of an incoming bitstream, comprising:

receiving an incoming bitstream including a current data type and associated data; and assigning a memory controller to the data type wherein the operation of assigning a memory controller to the data type includes the operations of:

comparing the current data type to an assigned data type of a currently active memory controller;

assigning the currently active memory controller to the current data type if the data type of the currently active memory controller is the same as the current data type;

assigning a next available memory controller to the current data type if the data type of the currently active memory controller is different than the current data type; and writing the associated data to a computer memory utilizing the memory controller assigned to the data type.

3. A method as recited in claim 2, wherein the next available memory controller is a memory controller having an associated memory address range not currently containing data.

4. A method as recited in claim 2, wherein the next available memory controller is a memory controller having an associated memory address range currently containing data having a data type equivalent to the current data type.

5. A method for controlling a memory storing at least a portion of an incoming bitstream, comprising:

receiving a request for data, wherein the data was initially received from an incoming bitstream;

determining an appropriate controller to read the requested data from a computer memory wherein the operation of determining an appropriate memory controller comprises the operations of:

examining a data type of the requested;

determining a memory controller assigned to the data type of the requested data;

determining whether an amount of data stored within a memory address range associated with the memory controller is greater than zero;

using the memory controller to read the requested data from the computer memory if the amount of data stored within the memory address range is greater than zero;

reading the requested data from the computer memory utilizing the appropriate memory controller; and alerting a second system component that a particular data type needs to be read.

6. A method as recited in claim 5, wherein the memory controller is one of a plurality of memory controllers.

7. A method as recited in claim 6, wherein each memory controller of the plurality of memory controllers includes an associated memory address range.

8. A method as recited in claim 7, wherein the requested data is read as a group of data utilizing the associated record of the amount of data stored in the memory controller's associated memory address range.

9. A method for controlling memory storing at least a portion of an incoming bitstream, comprising:

receiving an incoming bitstream including a current data type and associated data;

assigning a memory controller to the data type selected from a plurality of memory controllers wherein each memory controller controls at least one corresponding address range selected from a plurality of address ranges;

writing the associated data to a computer memory address range utilizing the memory controller assigned to said current data type and associated with said computer memory address range;

receiving a request for data;

determining an appropriate memory controller to read the requested data from the computer memory corresponding to the data type of the data requested;

reading the requested data stored in the memory address range of the computer memory utilizing the appropriate memory controller corresponding to said data type;

examining a data type of the requested data;

determining the memory controller assigned to the data type of the requested data;

determining whether an amount of data stored within a memory address range associated with the memory controller is greater than zero; and using the memory controller to read the requested data from the computer memory if the amount of data stored within the memory address range is greater than zero.

* * * * *